United States Patent [19]
Okubo

[11] Patent Number: 5,822,238
[45] Date of Patent: Oct. 13, 1998

[54] SEMICONDUCTOR MEMORY

[75] Inventor: Miyoshi Okubo, Kanagawa, Japan

[73] Assignee: NEC Corporation, Tokyo, Japan

[21] Appl. No.: 618,780

[22] Filed: Mar. 20, 1996

[30] Foreign Application Priority Data

Mar. 30, 1995 [JP] Japan ..................................... 7-072698

[51] Int. Cl.$^6$ ................................ G11C 8/00; G11C 5/06
[52] U.S. Cl. ...................... 365/230.03; 365/63; 365/205
[58] Field of Search .................................. 365/51, 52, 63, 365/205, 230.06, 230.03

[56] References Cited

U.S. PATENT DOCUMENTS

| | | | |
|---|---|---|---|
| 5,315,555 | 5/1994 | Choi ..................................... | 365/230.03 |
| 5,381,030 | 1/1995 | Kasai ........................................ | 257/390 |
| 5,517,457 | 5/1996 | Sakui et al. .......................... | 365/230.03 |

Primary Examiner—Huan Hoang
Attorney, Agent, or Firm—Foley & Lardner

[57] ABSTRACT

Memory cell columns formed by connecting a plurality of memory cells in a memory cell array block A1 by a predetermined number a1, a2, b1, b2 are arranged in the order of "a1, b1, b2 and a2"; a row decoder D1 for selecting a word line for the memory cell columns a1 and a2 and a row decoder D2 for selecting a word line for the memory cell columns b1 and b2 are arranged on both sides of the memory cell array block A1; a word line is connected via contact areas C1, C3 and C2; a word line is separated by areas H1 and H2 between memory cells respectively between the memory cell columns a1 and b1 and the memory cell columns b2 and a2; digital lines are connected to each other between the memory cell columns a1 and b1 and the memory cell columns b2 and a2; and one sense amplifier circuit is arranged every pitch between two cells.

5 Claims, 11 Drawing Sheets

SEMICONDUCTOR MEMORY

BACKGROUND OF THE INVENTION

1. Field of the Invention

The present invention relates to a semiconductor memory and more particularly to a semiconductor memory in which the mask layout is reduced.

2. Description of Related Art

As large scale integration of semiconductor memory is accelerated, the area of the memory cell pattern is also further being reduced. A circuit functioning as a sense amplifier for amplifying data read from a memory cell to a digital line out of circuits of the memory cell is connected to each digital line and is required to be reduced in accordance with reductions of the memory cell.

FIG. 7 is a block diagram schematically showing the layout of a semiconductor memory according to a prior art embodiment. In a memory cell array A1, a large number of memory cells M are arranged in a matrix. A row decoder D1 is a word line driving circuit connected to memory cells arranged in the direction of a column in the memory cell array A1 and is constituted by a group of circuits which respectively can drive a word line.

A word line which is an output line of the row decoder D1 comprises a second layer of wiring, and a first layer of word lines A1W1 to A1Wn with relatively low resistance is connected to a second layer of gate electrode wiring G11 to G1n with relatively high resistance via contact areas C11, C12 and C13 to be a word line for the memory cell. That is, word lines A1W1 to A1Wn function as an assistant wiring to reduce resistance in wiring from the output port of the row decoder D1 to a word electrode of a memory cell.

Circuits functioning as a sense amplifier (hereinafter called sense amplifier circuits) S111 to S11n, S121 to S12n, S131 to S13n and S141 to S14n are respectively connected to main digital lines T111 to T11n, T121 to T12n, T131 to T13n, T141 to T14n and reserve digital lines B111 to B11n, B121 to B12n, B131 to B13n, B141 to B14n which are connected to memory cells arranged in the direction of a column. One sense amplifier circuit is connected to each pair of main and reserve digital lines.

A memory cell array A2 in an area different from this memory cell array A1 has the same constitution as that of the memory cell array A1, and comprises a row decoder D2, first layers of word lines A2W1 to A2Wn, contact areas C21, C22 and C23, second layers of gate electrode wirings G21 to G2n, sense amplifier circuits S211 to S21n, S221 to S22n, S231 to S23n and S241 to S24n, main digital lines T211 to T21n, T221 to T22n, T231 to T23n and T241 to T24n, and reserve digital lines B211 to B21n, B221 to B22n, B231 to B23n and B241 to B24n.

FIGS. 8A and 8B are circuit diagrams respectively showing a portion of a memory cell M at the end in FIG. 7 and an example of a sense amplifier circuit. In FIG. 8A, a four transistor-type memory cell is shown. This circuit comprises bistable transistors Q1 and Q2 and transistors Q3 and Q4 functioning as a gate circuit, the drains of the transistors Q1 and Q2 respectively connected to drains of transistors Q3 and Q4, a word line G11 is connected to the gates of the transistors Q3 and Q4, the sources of transistors Q3 and Q4 respectively connected to a main digital line T111 and a reserve digital line B111, and the main digital line T111 and reserve digital line B111 connected to sense amplifier circuit S11.

A sense amplifier circuit shown in FIG. 8B is comprises N-channel transistors 1 to 3, the gate electrode of an N-channel transistor 1 being connected to a main digital line T111, the gate electrode of an N-channel transistor 2 being connected to a reserve digital line B111, and a selection signal IN from a column decoder being input to the gate electrode of an N-channel transistor 3. During operation, when the signal IN is at a high level, the N-channel transistor 3 is activated, and after signals on the main digital line T111 and the reserve digital line B111 are amplified, data is output from the train electrodes 4 and 5 functioning as an output line of the N-channel transistors 1 and 2.

FIG. 9 is a mask layout showing an example of a sense amplifier circuit shown in FIG. 8B. The sense amplifier circuit comprises an N-type diffusion layer 6, polysilicon gates 7 to 9, first layers of aluminum wirings 10 to 15, contacts 16 to 18 for connecting a first layer of aluminum wiring, and a polysilicon gate and contacts 19 to 21 for connecting a first layer of aluminum wiring and an N-type diffusion layer.

The gate electrodes of the N-channel transistors 1 to 3 shown in FIG. 8B are equivalent to polysilicon gates 7 to 9 shown in FIG. 9; and the main and reserve digital lines T111 and B111 and output lines 4 and 5 shown in FIG. 8B are respectively equivalent to aluminum wirings 10 and 11 and aluminum wirings 12 and 13 shown in FIG. 9.

When the condition of contacts P1 and P2 shown in FIG. 8B in a mask layout is checked in FIG. 9, devices comprising aluminum wiring and a contact cannot be formed there and the contacts are in a connection state having great resistance consisting of only an N-type diffusion layer 6 because a sense amplifier circuit is masked by a pitch L between memory cells. In a sense amplifier circuit for which high speed and stability are particularly required, a contact having great resistance in the circuit is a fatal defect and remarkable deterioration of the characteristics of the circuit is caused by such a contact. A mask layout shown in FIG. 9 is longer longitudinally due to limitation of a pitch L between memory cells as described above and therefore, causes the undesirable effect of increasing the size of the chip.

FIG. 10 is a waveform chart of voltage at contacts T111 and B111 in a sense amplifier circuit shown in FIG. 8B. Referring to this drawing, operation of a sense amplifier circuit will be described below. It is assumed that a memory cell is activated and signal voltage is read to main and reserve digital lines T111 and B111. At this time, the N-channel transistor 3 is also activated by a selection signal IN to a sense amplifier circuit and amplified signal waveforms 4 and 5 are output from output lines T111 and B111 of a sense amplifier circuit. Referring to the operating voltage level of a signal outputted from a sense amplifier circuit, the voltage level of approximately ½ VCC is appropriate in view of the characteristics of voltage applied to the adjacent circuit, and operation of waveforms 4 and 5 shown in FIG. 10 is desirable.

In the meantime, when the contacts P1 and P2 shown in FIG. 8B have great resistance, the operating voltage level of a sense amplifier circuit is higher (by V1) than the level of ½ VCC as shown by waveforms 4' and 5' shown in FIG. 10, and the amplitude V3 between voltage levels is also reduced. Further, the time at which waveforms 4' and 5' start to advance in opposite directions is also delayed by time T1 compared with the time of waveforms 4 and 5, and so the entire operation of the circuitry is delayed. The difference of potential V1 and the difference between V2 and V3 increases with resistance and the time at which waveforms 4' and 5' start to advance in opposite directions is also delayed. As the transistor driving capacity of the N-channel transistors 1, 2 and 3 must be increased to remove the difference of potential and the delay of operation, the area of the chip must be increased.

FIG. 11 is a circuit diagram showing a semiconductor memory disclosed in Japanese published unexamined patent application No. H3-97190 and in this semiconductor memory, a plurality of word lines in different memory cell array blocks are connected to one word line driving circuit. The constitution of memory cell arrays A1 and A2 and sense amplifier circuits S111 to S14n and S211 to S24n shown in FIG. 11 is the same as that shown in FIG. 7, however, FIG. 11 is different from FIG. 7 in that word lines A1W1, A1W2 to A1Wn in the memory cell array A1 and word lines A2W1, A2W2 to A2Wn in the memory cell array A2 are respectively connected to each other via the word line connecting wirings WL1, WL2 to SLn.

The operation of the above-described device will be described below. When a word line output circuit D11 is selected by a row decoder D1, an activation signal is applied to word lines A1W1 and A2W1 connected to the word line output circuit D11, and memory cells selected by this are activated and data stored in the memory cells is in a condition ready to be read to sense amplifier circuits S111 to S14n and S211 to S24n. At this time, all the memory cells connected to the word lines A1W1 and A2W1 are selected, but data stored in the plurality of memory cells is not read to the sense amplifier circuits because sense amplifier circuits S111 to S14n and S211 to S24n also select a sense amplifier circuit to be selected via a column decoder.

Similarly, when a word line output circuit D21 is selected by a row decoder D2, an activation signal is applied to word lines A1W2 and A2W2 connected to the word line output circuit D21, memory cells selected by this are activated, and data stored in the memory cells is in a condition ready to be read to sense amplifier circuits S111 to S14n and S211 to S24n. At this time, all the memory cells connected to the word lines A1W2 and A2W2 are selected, but data stored in the plurality of memory cells is not read to one sense amplifier circuit because the sense amplifier circuits S111 to S14n and S211 to S24n also select a sense amplifier circuit to be selected via a column decoder.

As described above, according to this constitution, a word line driving circuit can be arranged in a space for two word lines by connecting two word lines to one word line driving circuit, and the degree of integration can be enhanced by the degree equivalent to the reduction ratio of a memory cell.

As described above, according to the prior embodiment shown in FIG. 7, a mask layout of a sense amplifier circuit based upon reduction of a memory cell, that is, a pitch between main and reserve digital lines T111 to T11n, T121 to T12n, etc and B111 to B11n, etc. is very difficult. Even if sense amplifier circuits are arranged in the same pitch as that between digital lines, the characteristics of the circuit are remarkably deteriorated, the mask layout is longer in the direction of a digital line, and the area of the chip is increased.

According to the prior embodiment shown in FIG. 11, there are few elements useful to enhance the characteristics of circuitry, and even if a pattern which enhances the characteristics of a transistor is enabled owing to row decoders D1 and D2 in a mask layout, the effect produced by enhancing the characteristics of circuitry is small, because the amplitude of operating voltage between row decoders is generally approximately at the level of ground

SUMMARY OF THE INVENTION

The object of the present invention is to solve these problems, to reduce the size of the chip by devising an improved arrangement of a sense amplifier circuit, and to provide a semiconductor memory wherein the operating characteristics of a sense amplifier circuit are improved.

A semiconductor memory according to a first embodiment of the present invention is characterized in that a plurality of digital lines in different memory cell array blocks are respectively connected to one sense amplifier circuit, and is also characterized in that a plurality of digital lines are connected via the same signal line, and that a memory cell connected to a plurality of digital lines is also connected to different word lines.

A semiconductor memory according to a second embodiment of the present invention is characterized in that a plurality of digital lines in the same memory cell array block are respectively connected to one sense amplifier circuit, and is also characterized in that a word line driving circuit functioning as a row decoder for respectively driving a plurality of word lines in a memory cell array block is arranged on both sides of the above-described memory cell array block, memory cells in a group arranged in the direction of the word line are connected to a predetermined number of plural word lines, first and second memory cell columns a1 and a2 are formed by collecting a plurality of memory cells in a memory cell array block by a predetermined number with a sense amplifier circuit, and first and second memory cell columns b1 and b2 without a sense amplifier circuit are arranged in the order of "a1, b1, b2 and a2" or these memory cell columns are arranged in a different order, and that digital lines in the above-described a1 and b1 and digital lines in the above-described a2 and b2 can be also connected to each other.

DETAILED DESCRIPTION OF PREFERRED EMBODIMENT

First Embodiment

Figure 1:
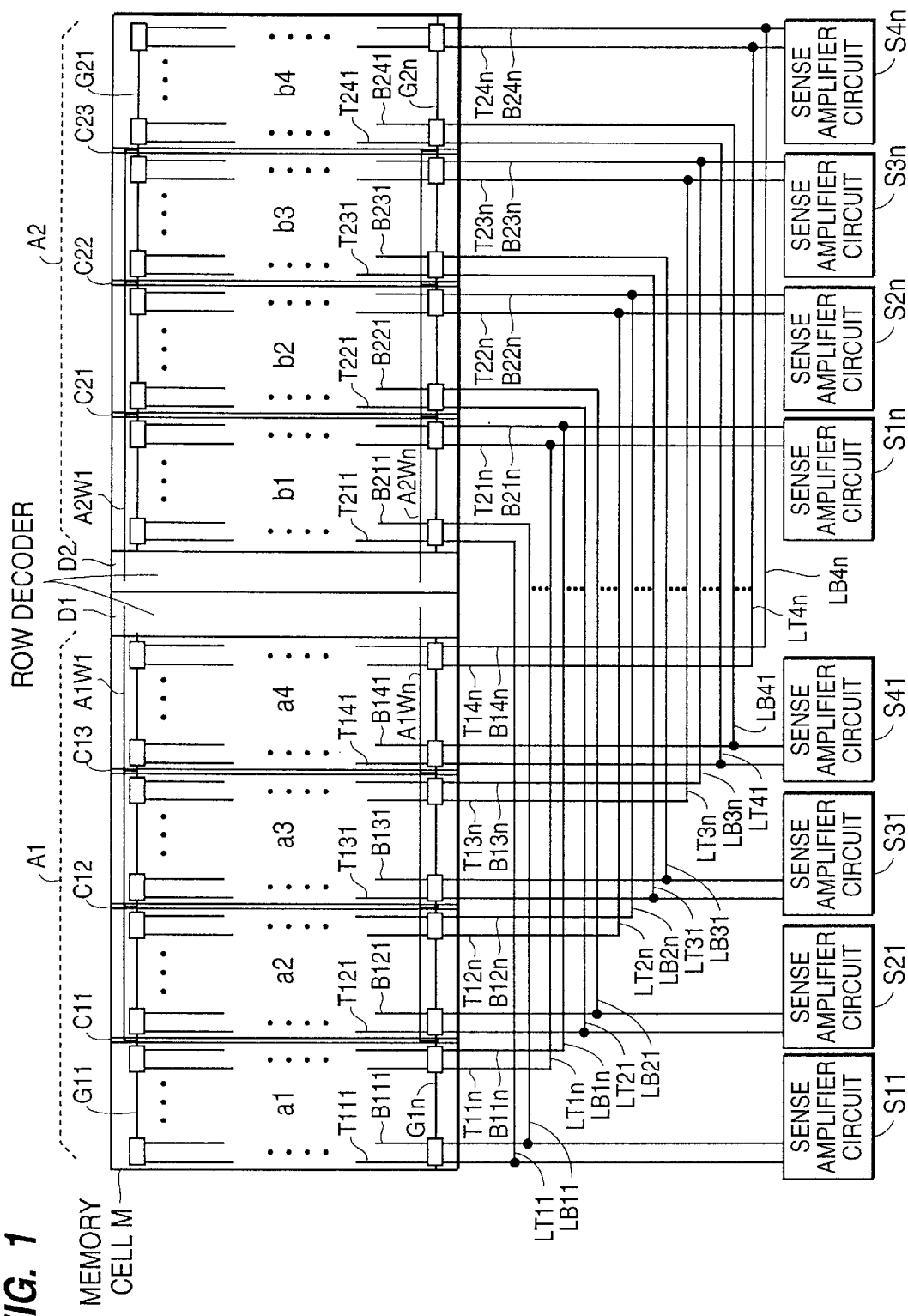
FIG. 1 is a block diagram schematically showing a first embodiment according to the present invention.

FIG. 1 is a block diagram schematically showing a first embodiment according to the present invention. In this embodiment, a plurality of digital lines from different memory cell array blocks are connected to one circuit functioning as a sense amplifier on a digital line.

Figure 7:
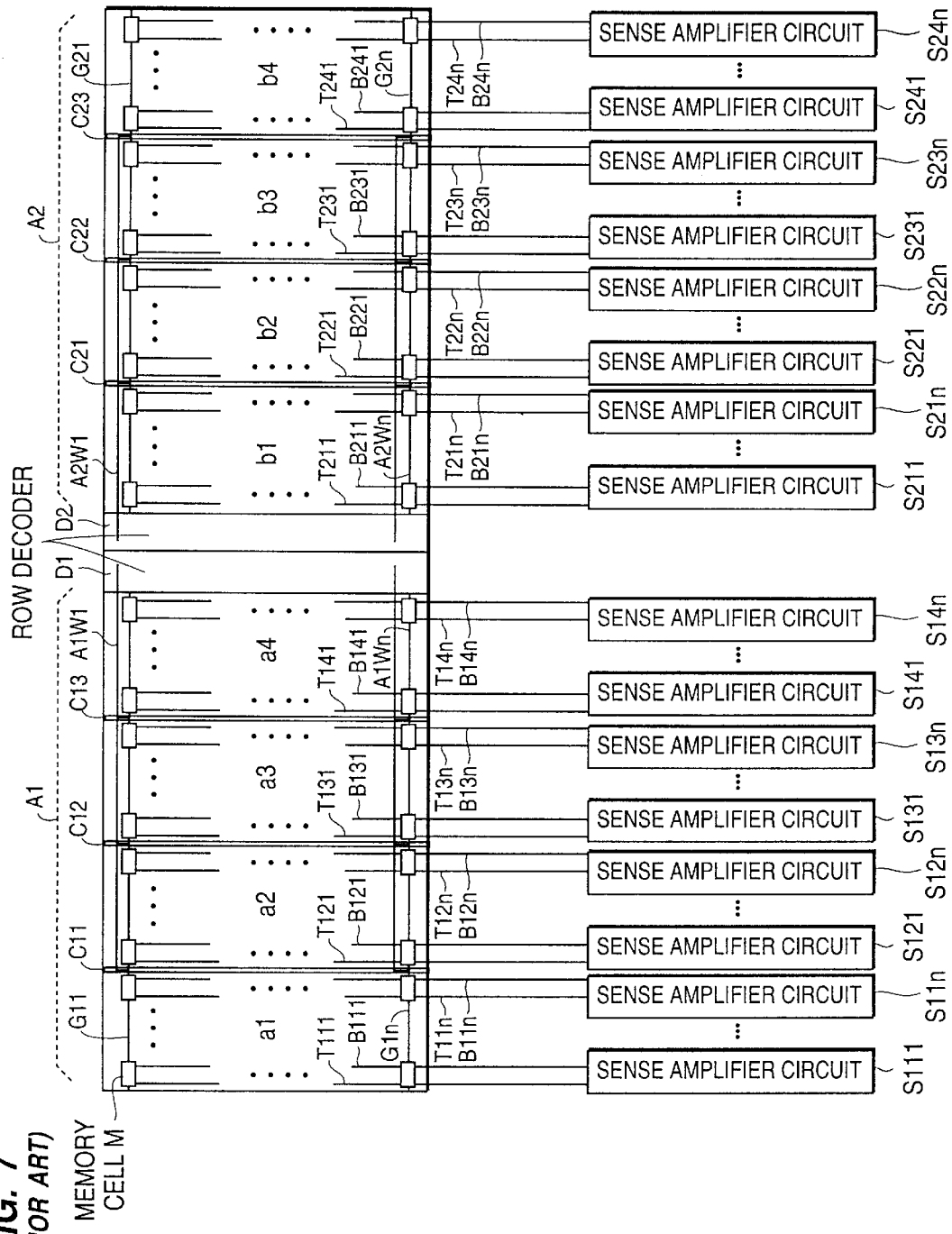
FIG. 7 is a block diagram schematically showing a conventional semiconductor memory.
Figure 8A:
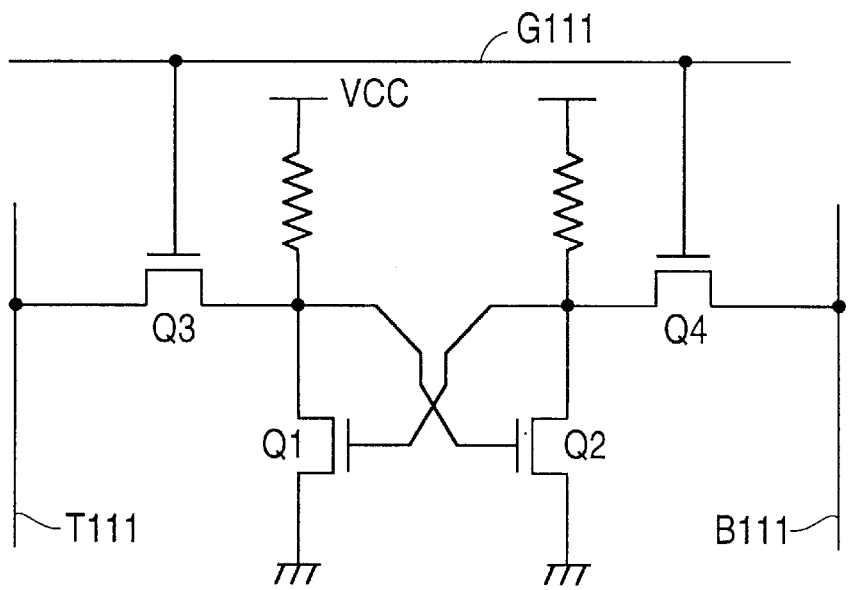
FIG. 8A and 8B are circuit diagrams showing an example of a memory cell and a circuit functioning-as a sense amplifier shown in FIG. 7.
Figure 8B:
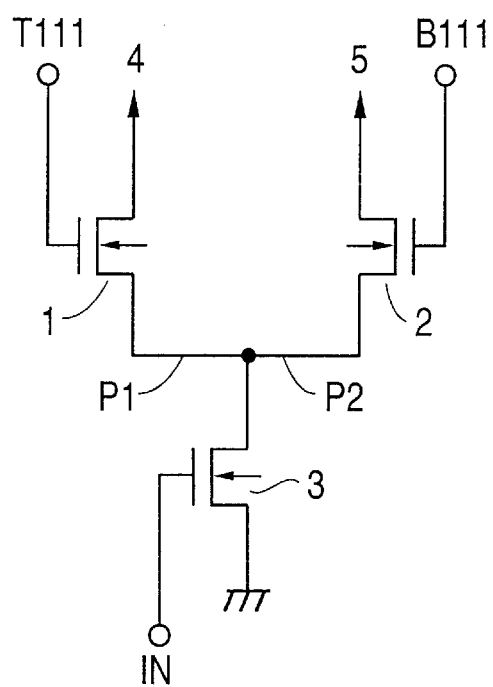
Figure 9:
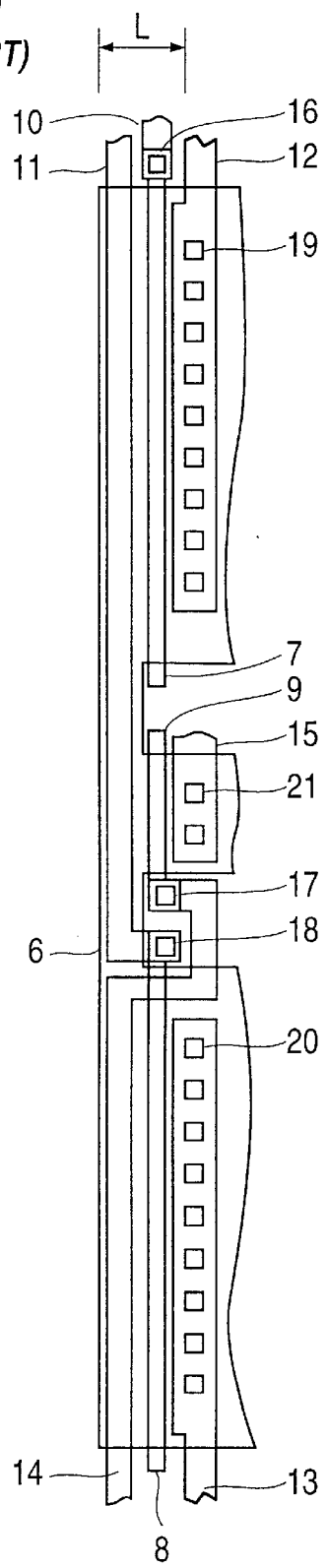
FIG. 9 is a mask layout for a circuit functioning as a sense amplifier shown in FIG. 7.
Figure 10:
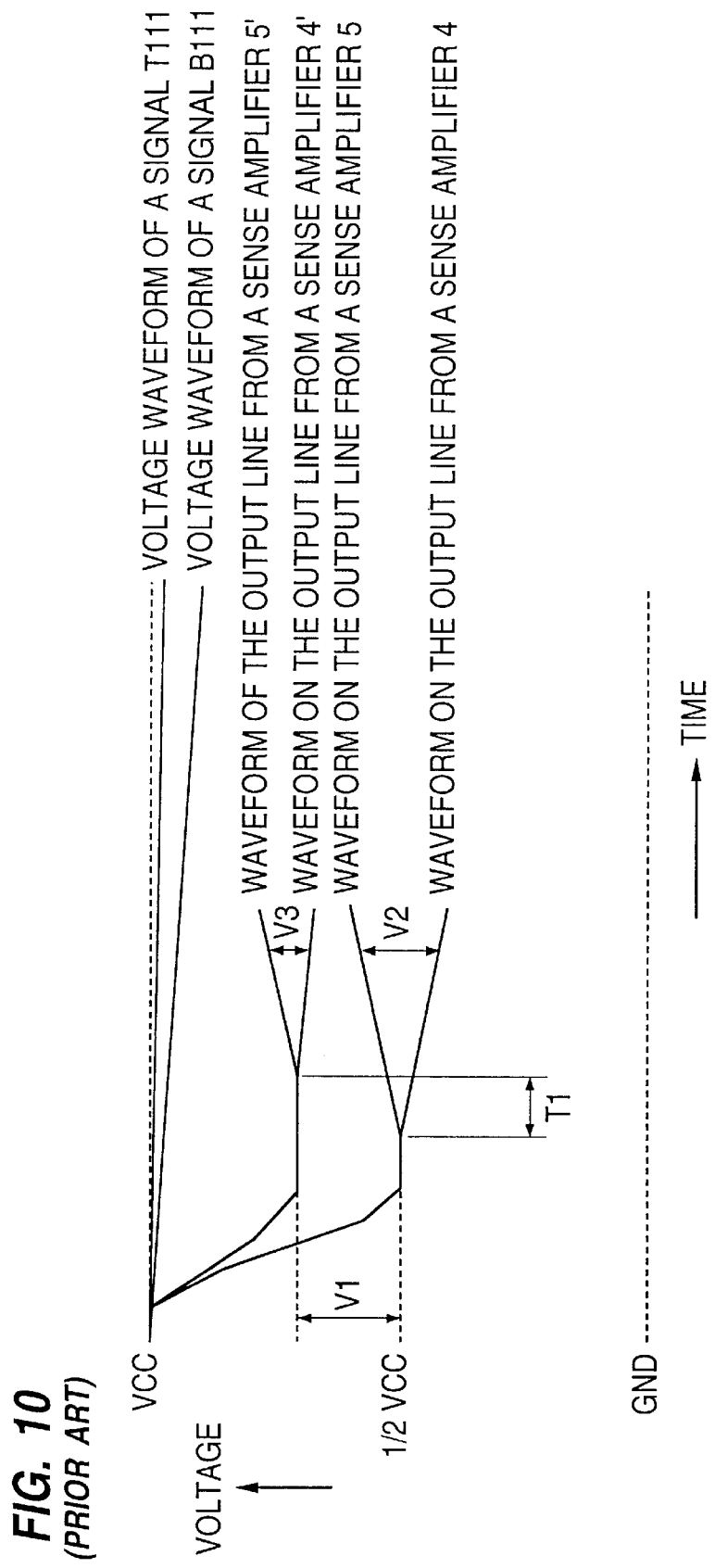
FIG. 10 is a waveform chart of voltage thereof showing the characteristic of a sense amplifier shown in FIG. 7.
Figure 11:
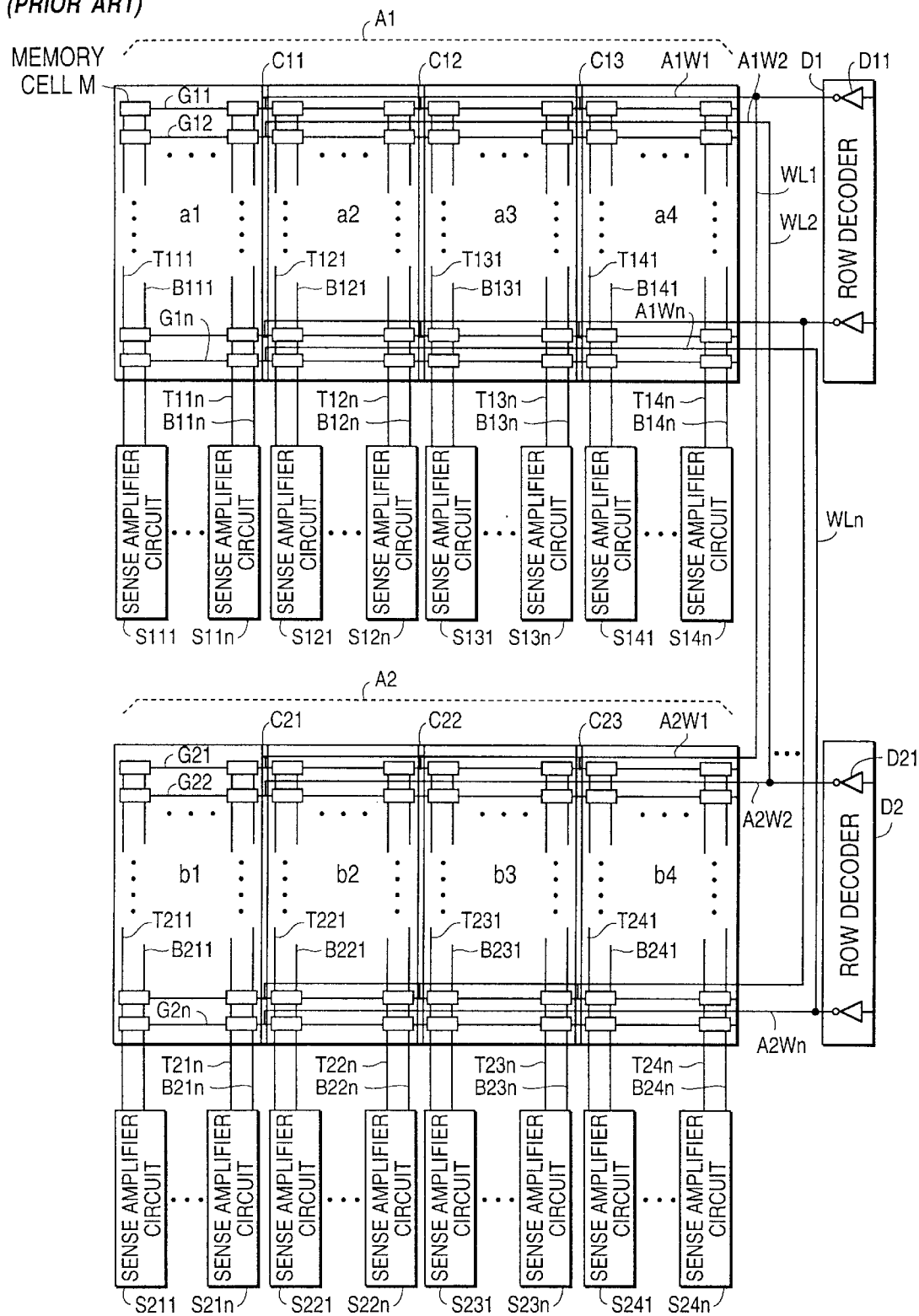
FIG. 11 is a block diagram schematically showing another conventional semiconductor memory.

FIG. 1 is different from FIG. 7 showing a conventional embodiment in that the main and reserve digital lines included in a memory cell array A1, namely, T111 to T11n, T121 to T12n, T131 to T13n, T141 to T14n and B111 to B11n, B121 to B12n, B131 to B13n, and B141 to B14n, are connected to the main and reserve digital lines included in the memory cell array A2, namely, T211 to T21n, T221 to T22n, T231 to T23n, T241 to T24n and B211 to B21n, B221 to B22n, T231 to B23n, and B241 to B24n, via digital connecting lines LT11 to LT1n, LT21 to LT2n, LT31 to LT3n, LT41 to LT4n and LB11 to LB1n, LB21 to LB2n, LB31 to LB3n, LB41 to LB4n. FIG. 1 is also different in that one sense amplifier circuit S11, S21 to S4n is respectively connected to a set of digital connecting lines LT11 and LB11, LT21 and LB21 to LT4n and LB4n.

As each sense amplifier circuit S11 to S4n is connected to two pairs of main and reserve digital lines T111 and T211, and B111 and B211 to T14n and T24n, and B14n and B24n as described above, a pitch between adjacent sense amplifier circuits is twice as long as that according to a conventional embodiment shown in FIG. 7. Therefore, according to this embodiment, one sense amplifier circuit can be connected to two pairs of main and reserve digital lines included in different memory cell array areas and the area of the sense amplifier circuit can be prevented from being increased.

Figure 2:
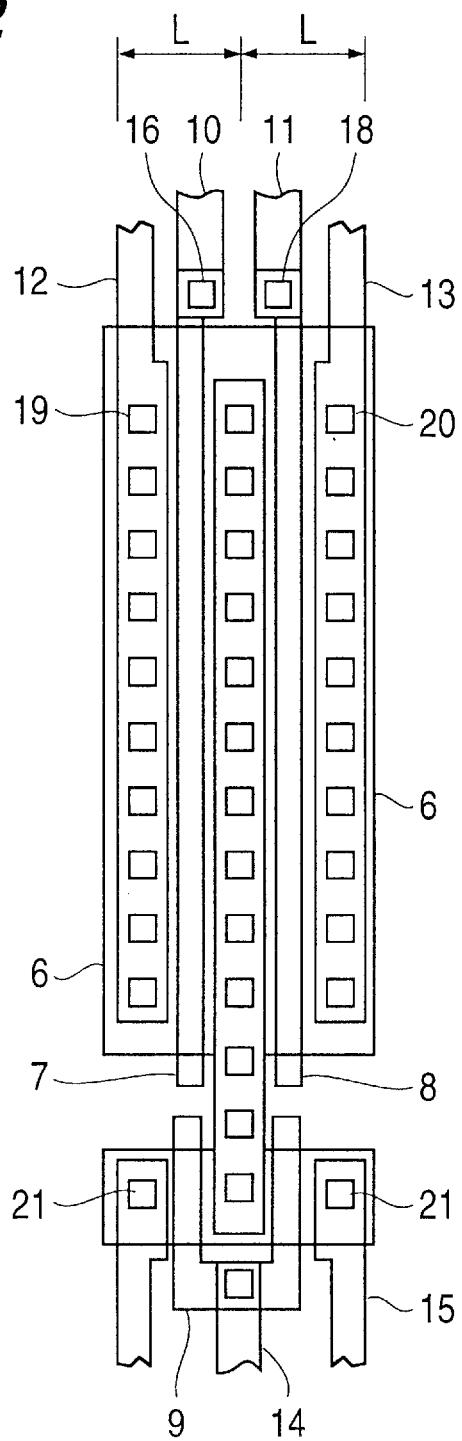
FIG. 2 is a mask layout for a part of a circuit functioning as a sense amplifier shown in FIG. 1.

FIG. 2 is a mask layout for a sense amplifier circuit shown in FIG. 1 if this embodiment is used. A pattern layer constituting this mask layout is the same as that in a conventional embodiment, however, the above-described mask layout according to this embodiment is different from that in the conventional embodiment because there is room for the arrangement of polysilicon gates 7 to 9, aluminum wirings 10 to 15 and contacts 16 to 21 because a mask layout for a sense amplifier circuit is enabled which is twice as long as a pitch L between adjacent memory cells, there is no connection having great resistance which causes deterioration of the characteristics of the circuit, the longitudinal length of a mask layout is reduced, and the area of the chip is reduced.

Heretofore, an embodiment of the invention in which two pairs of main and reserve digital lines are connected to one sense amplifier circuit was given as an example, however, in alternative embodiments three or four pairs of main and reserve digital lines can also be connected to one sense amplifier circuit, and the same effect as described above can be obtained and the object of the present invention can be achieved.

Second Embodiment

Figure 3:
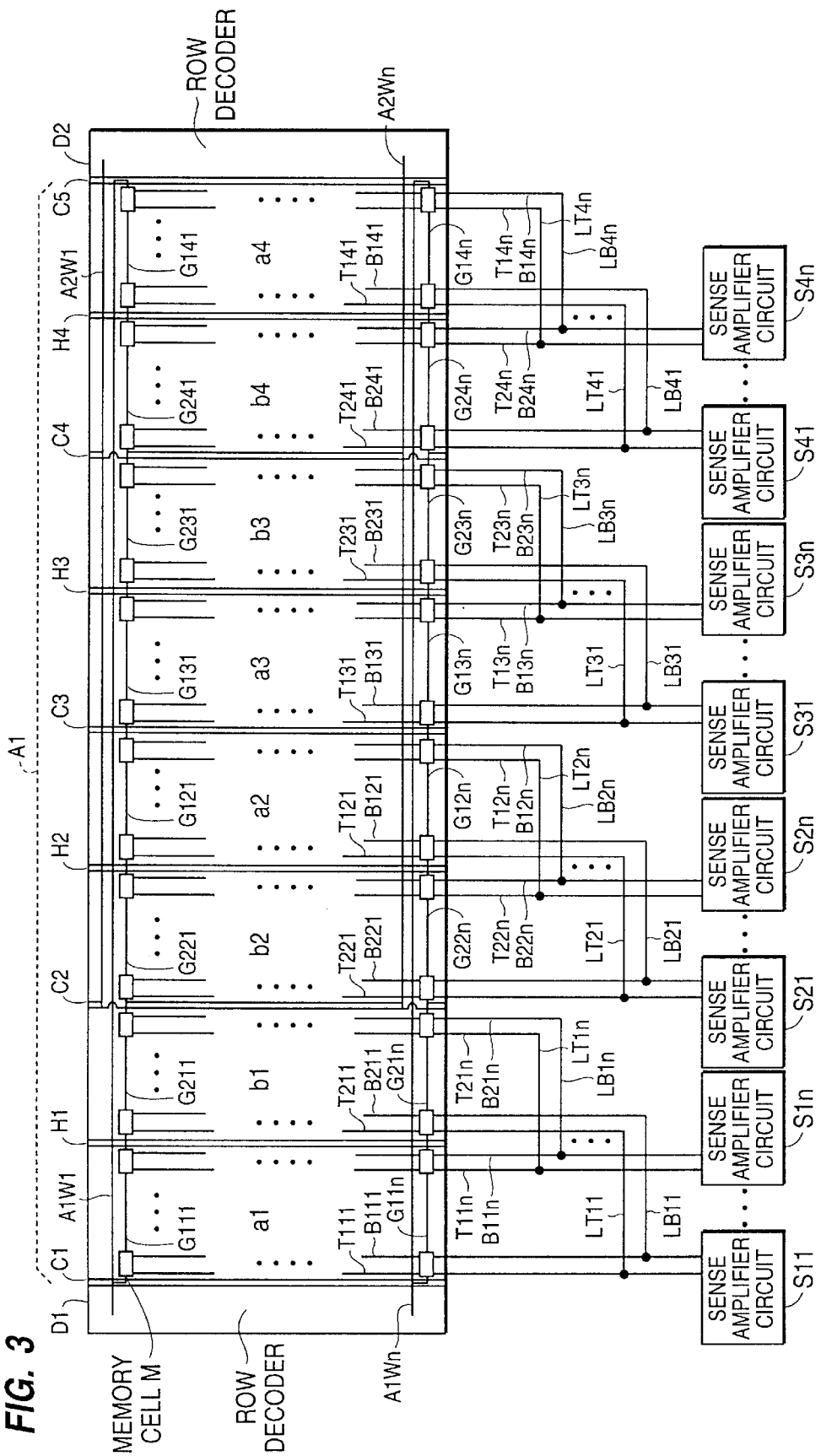
FIG. 3 is a block diagram schematically showing a second embodiment according to the present invention.

FIG. 3 is a block diagram schematically showing a second embodiment according to the present invention. Referring to a memory cell array A1 shown in FIG. 3, a large number of memory cells are arranged in the form of a matrix. Row decoders D1 and D2 for driving memory cells in the memory cell array A1 are arranged on both sides of the memory cell array A1. The output lines of the row decoder D1 are comprised of first layers of metallic wiring A1W1 to A1Wn and are wired in the of a row of the memory cell array A1. The wiring layers A1W1 to A1Wn are respectively connected to second layers of gate electrode wirings G111 to G11n, G121 to G12n, G131 to G13n, and G141 to G14n via contact areas C1, C3 and C5, and words stored in memory cells in memory cell columns a1, a2, a3 and a4 can be activated. Similarly, the output lines of the row decoder D2 are constituted by first layers of metallic wiring A2W1 to A2Wn, are connected to second layers of gate electrode wirings G211 to G21n, G221 to G22n, G231 to G23n and G241 to G24n via contact areas C2 and C4, and words stored in memory cells in memory cell columns b1, b2, b3 and b4 can be activated.

As each row decoder performs independent circuitry operation, no plural lines of output lines A1W1 to A1Wn of the row decoder D1 and output lines A2W1 to A2Wn of the row decoder D2 are activated. Further, the gate electrode wirings G111 to G11n and G211 to G21n, G121 to G12n and G221 to G22n, G131 to G13n and G231 to G23n, and G141 to G14n and G241 to G24n, are disconnected from each other respectively by areas between memory cells H1, H2, H3 and H4. Referring to the areas between memory cells H1, H2, H3 and H4, as they are provided only to disconnect the gate electrode wirings, they may be extremely small in area and have little effect upon the size of the chip.

Next, the main and reserve digital lines T111 to T11n and B111 to B11n of the memory cell column a1 are connected to the main and reserve digital lines T211 to T21n and B211 to B21n of the memory cell column b1 via digital connecting wirings LT11 to LT1n and LB11 to LB1n, and one sense amplifier circuit S11 to S1n is respectively connected to a combination of the digital connecting wirings LT11 and LB11 to LT1n and LB1n. Similarly, main and reserve digital lines in each group of memory cell columns a2 and b2, a3 and b3, and a4 and b4 are also constituted in the same way as the above-described main and reserve digital lines, and one sense amplifier circuit is connected to each combination of digital connecting wirings.

The area of a wiring area in a mask layout of a digital connecting wiring according to this embodiment can be reduced significantly because such a digital connecting wiring connects memory cell columns formed by dividing a memory cell array to many main and reserve digital lines.

Operation in such embodiments will be described below. If for example, a wiring layer A1W1 is selected by a row decoder D1, the memory cell columns in which word lines are to be selected are a1, a2, a3 and a4. At this time, the memory cell columns b1, b2, b3 and b4 in which word lines are selected by a row decoder D2 are not activated. As main and reserve digital lines connected in a combination of memory cell columns a1 and b1, a2 and b2, a3 and b3, and a4 and b4 are respectively connected to a sense amplifier circuit S11 to S1n, S21 to S2n, S31 to S3n, and S41 to S4n, data in a plurality of memory cells is never input simultaneously. Therefore, according to this embodiment, one sense amplifier circuit can be connected to two pairs of main and reserve digital lines in the same memory cell array area.

Referring to a mask pattern for a sense amplifier circuit, as a mask layout in the dimensions twice as long as a pitch L between memory cells is also enabled in this embodiment as in the first embodiment, a mask layout for a sense amplifier circuit shown in FIG. 2 is enabled. Therefore, in this embodiment, the characteristics of a sense amplifier circuit can be enhanced, the longitudinal length of a mask layout can be reduced, and the area of the chip can be reduced.

Embodiments in which one sense amplifier circuit is connected to two pairs of main and reserve digital lines are described above as an example, however, alternative embodiments can be also employed, for example, one sense amplifier circuit can be also connected to three or four pairs of main and reserve digital lines, in which case the above-described effect can be obtained and the object of the present invention can be achieved.

Figure 4A:
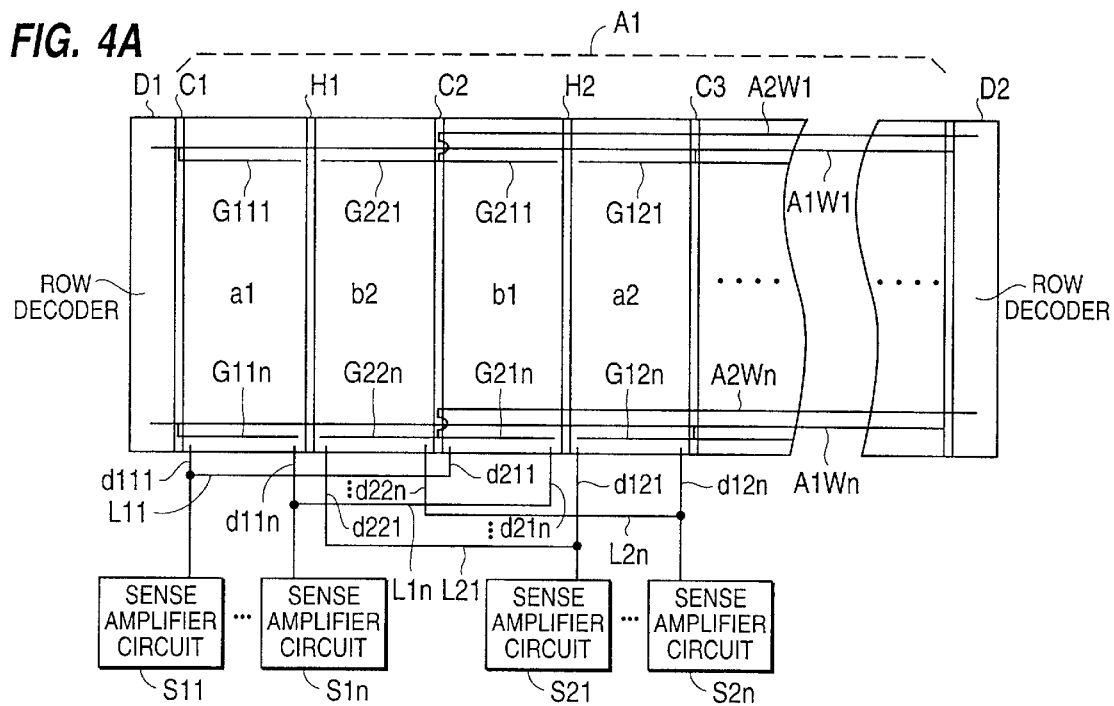
FIGS. 4A and 4B are block diagrams schematically showing another two layouts according to a second embodiment.
Figure 4B:
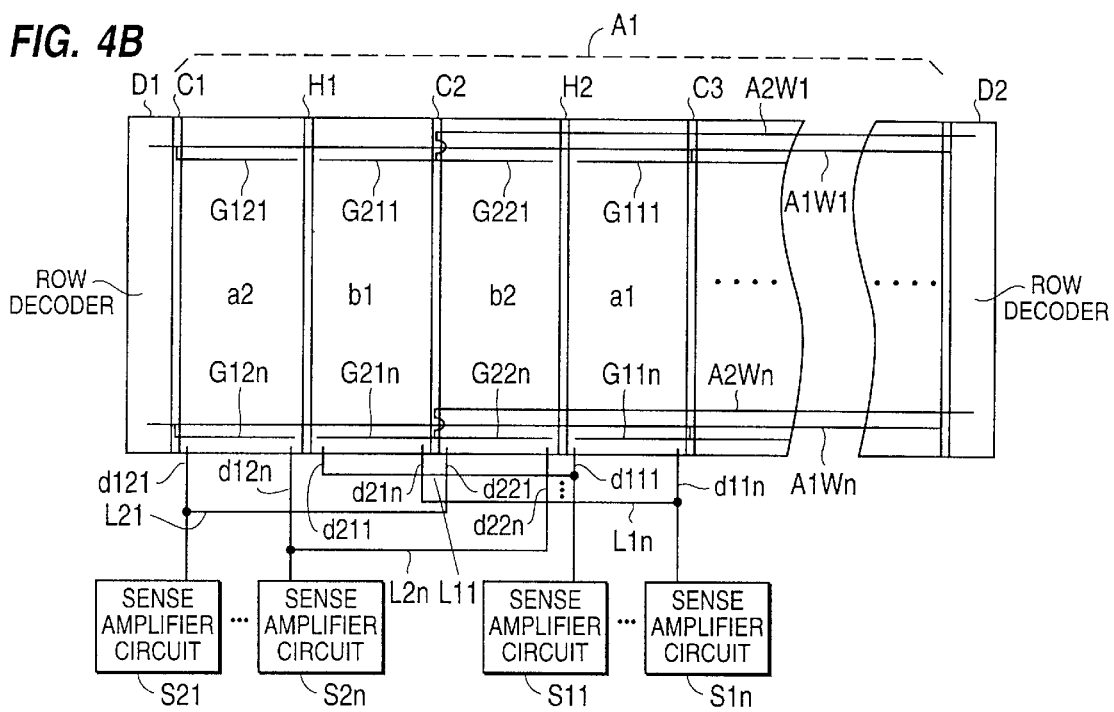

FIGS. 4A and 4B are block diagrams schematically showing the entire constitution of circuitry and showing layout formed by partly changing a layout according to the second embodiment of the present invention. Referring to FIG. 4A, row decoders D1 and D2 are arranged on both sides of a memory cell array A1. Output lines of the row decoder D1 are constituted by first word lines A1W1 to A1Wn, and are further connected to second word lines G111 to G11n and G121 to G12n respectively via contact areas C1 and C3, and words stored in memory cells in memory cell columns a1 and a2 can be activated. Similarly, output lines of the row decoder D2 are constituted by first word lines A2W1 to A2Wn, and are further respectively connected to second word lines G211 to G21n and G221 to G22n via a contact area C2, and words stored in memory cells in memory cell columns b1 and b2 can be activated. The second word lines G111 to G11n and G221 to G22n are separated by an area H1 between memory cells and the second word lines G121 to G121 and G211 to G21n are separated by an area H2 between memory cells.

In FIG. 4A, main and reserve digital lines T111 to T11n and B111 to B11n shown by two lines in FIG. 3 are shown by one digital line d111 to d11n. Memory cell array A1 includes a memory cell column a1 of which main and reserve digital lines D111 to D11n are respectively connected to a sense amplifier circuit S11 to S1n, a memory cell column a2 of which main and reserve digital lines d121 to d12n are respectively connected to a sense amplifier circuit S21 to S2n, and memory cell columns b1 and b2 without a sense amplifier circuit are arranged in the order of "a1, b2, b1 and a2". Further, the main and reserve digital lines d111 to d11n of the memory cell column a1 and the main and reserve digital lines d211 to d21n of the memory cell column b1 are connected via a digital connecting line L11 to L1n, and the main and reserve digital lines d121 to d12n of the memory cell column a2 and the main and reserve digital lines d221 to d22n of the memory cell column b2 are connected via a digital connecting line L21 to L2n.

As described above, as in this embodiment, one sense amplifier circuit can be connected to two pairs of main and reserve digital lines in a combination of the memory cell columns a1 and b1 and memory cell columns a2 and b2, the characteristics of circuitry can be enhanced, and the area of the chip can be reduced as in the second embodiment.

Referring to FIG. 4B, second word lines G111 to G11n and G221 to G22n are disconnected by an area H2 between memory cells, and second word lines G121 to G12n and G211 to G21n are disconnected by an area H1 between memory cells differently from FIG. 4A. Memory cell array A1 includes a memory cell column a1 of which main and reserve digital lines d111 to d1n are respectively connected to a sense amplifier circuit S11 to S1n, a memory cell column a2 of which main and reserve digital lines D121 to D12n are respectively connected to a sense circuit S21 to S2n, and memory cell columns b1 and b2 without a sense amplifier circuit are arranged in the order of "a2, b1, b2 and a1".

These first and second memory cell columns a1 and a2 with a sense amplifier circuit and first and second memory cell columns b1 and b2 without a sense amplifier circuit can be arranged in alternative orders as shown in Table 1.

TABLE 1

Figure 5A:
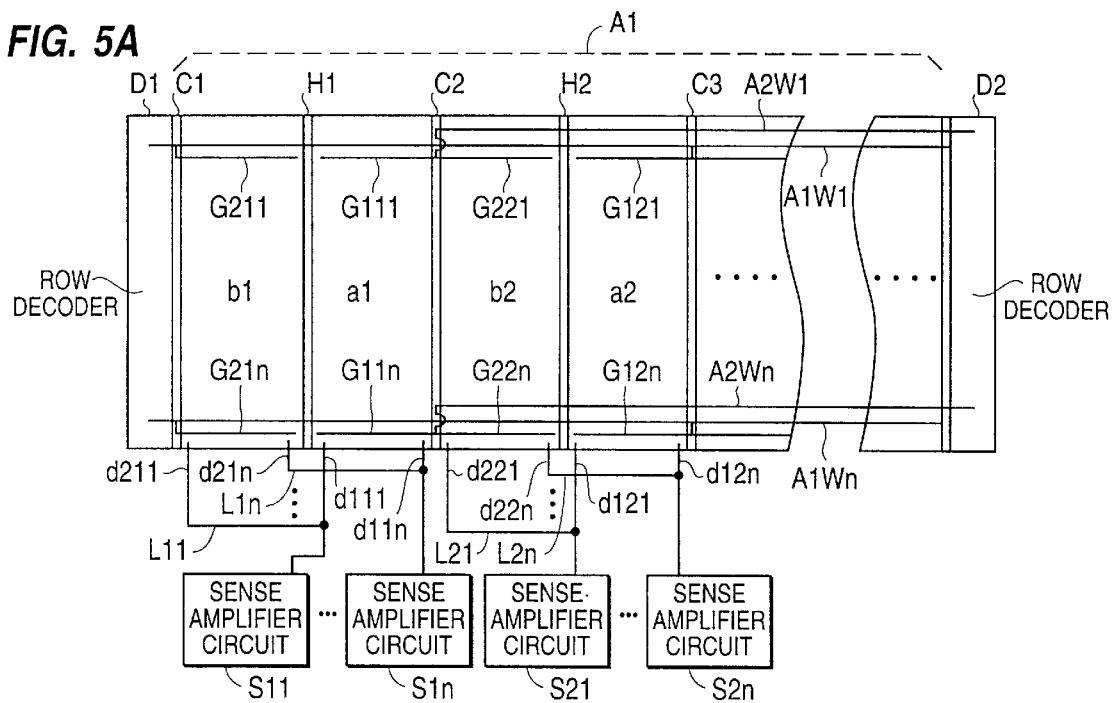
FIGS. 5A and 5B are block diagrams schematically showing further other two layouts according to a second embodiment.
Figure 5B:
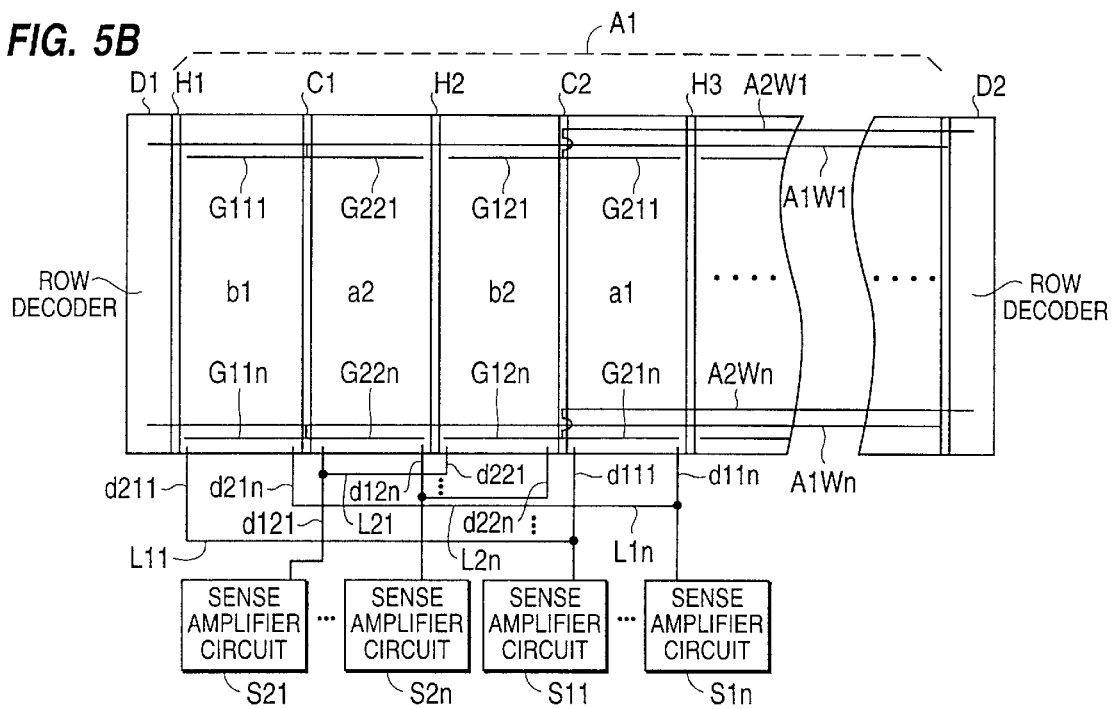

| No | Arrangement | Corresponding drawing | No | Arrangement | Corresponding drawing |
|----|-------------|----------------------|----|-------------|----------------------|
| 1  | a1b1b2a2    | FIG. 3               | 9  | a1b1a2b2    |                      |
| 2  | a1b2b1a2    | FIG. 4A              | 10 | a1b2a2b1    |                      |
| 3  | a2b1b2a1    | FIG. 4B              | 11 | a2b1a1b2    |                      |
| 4  | a2b2b1a1    |                      | 12 | a2b2a1b1    |                      |
| 5  | b1a1a2b2    |                      | 13 | b1a1b2a2    | FIG. 5A              |
| 6  | b1a2a1b2    |                      | 14 | b1a2b2a1    | FIG. 5B              |
| 7  | b2a1a2b1    |                      | 15 | b2a1b1a2    |                      |
| 8  | b2a2a1b1    |                      | 16 | b2a2b1a1    |                      |

FIGS. 5A and 5B show layouts of alternative arrangements shown in Table 1. Referring to FIG. 5A, second word lines G111 to G11n and G211 to G21n are separated by an area H1 between memory cells, second word lines G221 to G22n and G121 to G12n are separated by an area H2 between memory cells, and in a memory cell array A1, memory cell column a1 has main and reserve digital lines d111 to d11n respectively connected to sense amplifier circuits S11 to S1n, memory cell column a2 has main and reserve digital lines d121 to d12n respectively connected to sense amplifier circuits S21 to S2n, and memory cell columns b1 and b2 without a sense amplifier circuit are arranged in the order of "b1, a1, b2 and a2". Referring to FIG. 5B, second word lines G111 to G11n and G211 to G21n are separated by areas H1 and H3 between memory cells, second word lines G221 to G22n and G121 to G12n are separated by an area H2 between memory cells, and memory cell columns a1, a2, b1 and b2 are arranged in the order of "b1, a2, b2 and a1".

Third Embodiment

Figure 6:
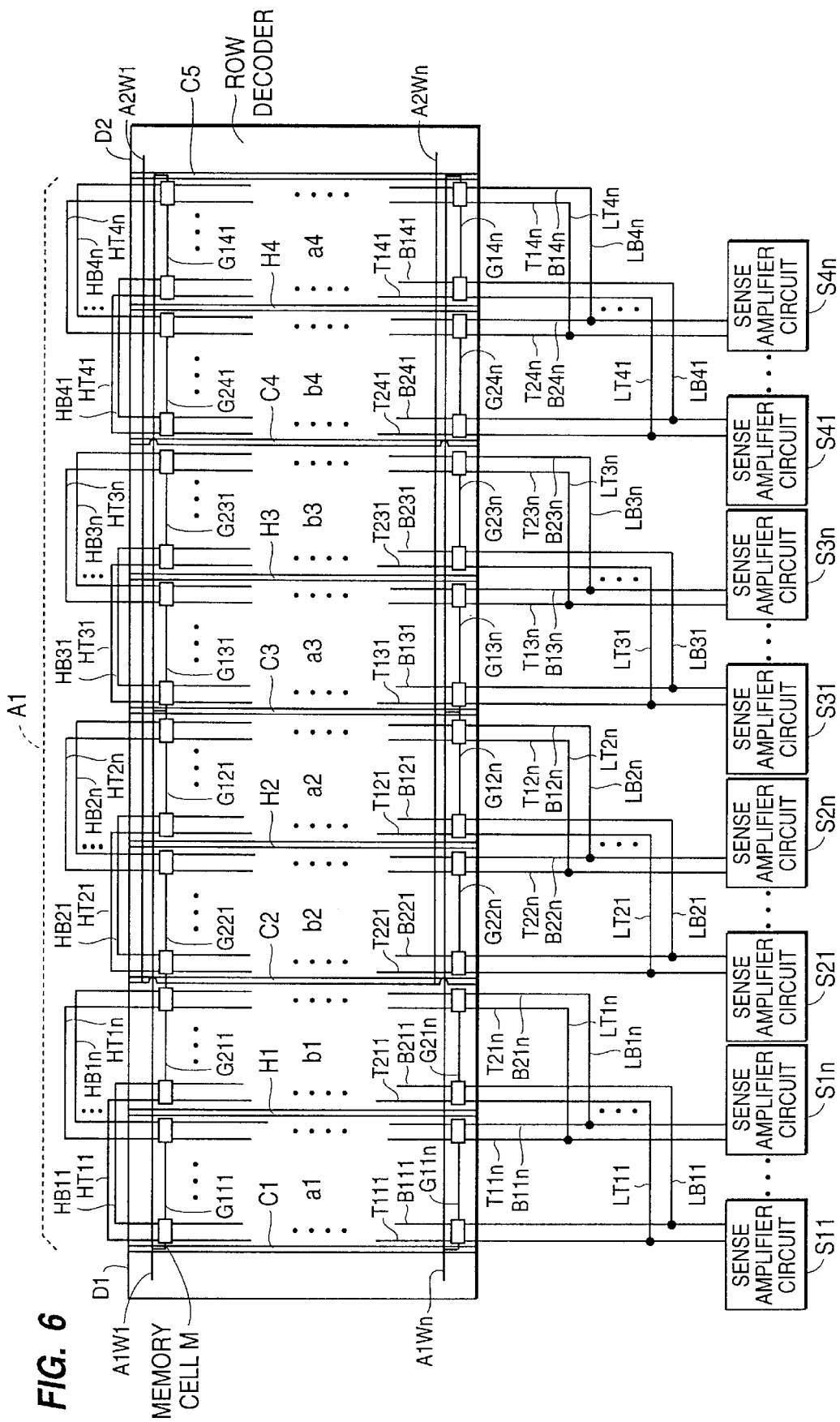
FIG. 6 is a block diagram schematically showing a third embodiment according to the present invention.

FIG. 6 is a block diagram schematically showing a third embodiment according to the present invention. This embodiment is similar to that according to the second embodiment, and the different features will be described below.

Main and reserve digital lines T111 to T11n and B111 to B11n of a memory cell column a1 are also respectively connected to main and reserve digital lines T211 to T21n and B211 to B21n of a memory cell column b1 via second digital connecting wirings HT11 to HT1n and HB11 to HB1n. That is, the main and reserve digital lines T111 to T11n and B111 to B11n are respectively connected in a ring by being connected via the first digital connecting wirings LT11 to LT1n and LB11 to LB1n, and the second digital connecting wirings HT11 to HT1n and HB11 to HB1n. Each group of main and reserve digital lines of memory cell columns a2 and b2, a3 and b3, and a4 and b4 is also constituted in a ring similarly At this time, a large load of parasitic resistance in wiring is applied to the memory cell connected farthest from the sense amplifier circuit S11 to S1n when data is read because the digital line from the I/O port of the memory cell to the input port of a sense amplifier circuit S11 to S1n is long. As this parasitic resistance has a great effect upon a data reading rate of a memory cell in view of a time constant, it is desirable that parasitic resistance is extremely small. As this embodiment is provided with ringed digital wiring as described above, this problem described above can be improved. That is, as a memory cell farthest from the sense amplifier circuit S11 to S1n reads data via a combination of two digital lines T111 to T11n and T211 to T21n, B111 to B11n and B211 to B21n, and a combination of two digital connecting wirings LT11 to LT1n and HT11 to HT1n, LB11 to LB1n and HB11 to HB1n, parasitic resistance is reduced by approximately a half, compared with that in the first embodiment. As a digital connecting wiring connects divided memory cell columns to many main and reserve digital lines in a memory cell array as described in relation to the first embodiment, a wiring area can be significantly reduced and parasitic resistance can be also significantly reduced because the length of wiring is short.

As described above, according to this embodiment, the characteristics of the sense amplifier circuit can be enhanced, the area of the chip can be reduced and further, a read rate a memory cell can be also accelerated as in the first and second embodiments.

As described above, because of the mask pattern in which a plurality of digital lines in different memory cell array blocks are connected to a sense amplifier circuit which is provided according to the present invention, the area of a mask layout for a sense amplifier circuit connected to digital lines can be reduced up to approximately a half of that in the conventional embodiment. Further, a mask layout in which connections having great resistance which deteriorate the characteristics of a sense amplifier circuit can be avoided, the area of the chip can be reduced and the characteristics of the circuit can be enhanced.

What is claimed is:

1. A semiconductor memory comprising:

a first memory cell array having a plurality of memory cells and a second memory cell array having plurality of memory cells arranged in a first direction, said first memory cell array having a predetermined number of first bit lines elongated in a second direction different from said first direction, and said second memory cell array having said predetermined number of second bit lines elongated in said second direction; and a plurality of amplifier circuits provided correspondingly to said first bit lines and arranged in said first direction, each of said amplifier circuits connected to a corresponding bit line of said first bit lines and a corresponding bit line of said second bit lines in common.

2. The semiconductor memory of claim 1, further comprising:

a first decoder for selecting a first memory cell of said first memory cell array in response to a first address signal for transferring a data of said first memory cell to said corresponding amplifier; and a second decoder for selecting a second memory cell of said second memory cell array in response to a second address signal different from said first address signal for transferring a data of said second memory cell to said corresponding amplifier.

3. The semiconductor memory of claim 2, further comprising a wiring connected between an end of said first bit line and said corresponding second bit line, each of said first bit line and said corresponding second bit line having opposite end connected to same amplifier.

4. The semiconductor memory of claim 1, further comprising a wiring connected between an end of said first bit line and said corresponding second bit line, each of said first bit line and said corresponding second bit line having an opposite end connected to the same amplifier.

5. A semiconductor memory, comprising:

a plurality of digital lines in the same memory cell array block respectively connected to one sense amplifier circuit;

a word line driving circuit for driving a plurality of word lines in a memory cell array block, said word line driving circuit being arranged on both sides of said memory cell array block;

a group of memory cells provided in the direction of said word lines and connected to predetermined plural word lines; and a plurality of digital lines connected in a ring via the same signal line.

* * * * *